(12) United States Patent
Xia et al.

(10) Patent No.: US 8,987,710 B2
(45) Date of Patent: Mar. 24, 2015

(54) CARBONACEOUS NANOMATERIAL-BASED THIN-FILM TRANSISTORS

(75) Inventors: Yu Xia, Skokie, IL (US); He Yan, Kowloon (HK); Antonio Facchetti, Chicago, IL (US)

(73) Assignee: Polyera Corporation, Skokie, IL (US)

( * ) Notice: Subject to any disclaimer, the term of this patent is extended or adjusted under 35 U.S.C. 154(b) by 223 days.

(21) Appl. No.: 13/477,030

(22) Filed: May 21, 2012

(65) Prior Publication Data

US 2013/0048949 A1    Feb. 28, 2013

Related U.S. Application Data

(60) Provisional application No. 61/487,931, filed on May 19, 2011.

(51) Int. Cl.

| | | |
|---|---|---|
| H01L 29/08 | (2006.01) | |
| H01L 51/40 | (2006.01) | |
| H01L 29/51 | (2006.01) | |
| H01L 29/778 | (2006.01) | |
| H01L 29/16 | (2006.01) | |
| B82Y 10/00 | (2011.01) | |
| H01L 51/05 | (2006.01) | |
| H01L 29/06 | (2006.01) | |
| H01L 51/00 | (2006.01) | |

(52) U.S. Cl.
CPC ........... *H01L 29/517* (2013.01); *H01L 29/778* (2013.01); *H01L 29/1606* (2013.01); *B82Y 10/00* (2013.01); *H01L 51/0537* (2013.01); *H01L 29/0669* (2013.01); *H01L 51/0048* (2013.01); *H01L 51/0545* (2013.01)
USPC ............... 257/40; 257/E51.001; 438/99

(58) Field of Classification Search
USPC ........ 257/24, 40, 288, E51.001; 438/99, 780, 438/790; 428/447; 528/35
See application file for complete search history.

(56) References Cited

U.S. PATENT DOCUMENTS

| | | | |
|---|---|---|---|
| 7,678,463 B2 * | 3/2010 | Marks et al. ............... | 428/447 |
| 2009/0050876 A1 * | 2/2009 | Marks et al. ............... | 257/24 |

* cited by examiner

*Primary Examiner* — Jose R Diaz
(74) *Attorney, Agent, or Firm* — Karen K. Chan

(57) ABSTRACT

Disclosed are thin film transistor devices incorporating a thin film semiconductor derived from carbonaceous nanomaterials and a dielectric layer composed of an organic-inorganic hybrid self-assembled multilayer.

18 Claims, 2 Drawing Sheets

CARBONACEOUS NANOMATERIAL-BASED THIN-FILM TRANSISTORS

CROSS REFERENCE TO RELATED APPLICATIONS

This application claims priority to and the benefit of U.S. Provisional Patent Application Ser. No. 61/487,931, filed on May 19, 2011, the disclosure of which is incorporated by reference herein in its entirety.

BACKGROUND

Materials with nanometer dimensions, defined as having at least one dimension less than about 100 nm, have received steadily growing interest due to their unique properties and application potential, oftentimes superior to their bulk counterparts. Examples include zero-dimensional nanoparticle (1), one-dimensional nanowires (2-4), and two-dimensional (2D), graphenes (5-7). Because of the quantum confinement of electrons in one or more dimensions, novel electrical, optical, and magnetic properties can be achieved in nanostructures. Currently, carbonaceous nanomaterials such as carbon nanotubes (CNTs), graphene, graphene oxides, graphite sheets, carbon nanodots hold the most promise among nanoscale materials.

In particular, carbon nanotubes are categorized as single-walled carbon nanotubes (SWCNTs) and multi-walled carbon nanotubes (MWCNTs). SWCNTs can be conceptualized by rolling a single sheet of graphene into a seamless cylinder; whereas MWCNTs consist of multiple rolled layers (concentric tubes) of graphene. Depending on the chirality along the graphene sheet, either semiconducting or metallic electronic states are created (8). Both experiments and theory have shown that SWCNTs possess high mobility (on the order of 100000 $cm^2 V^{-1} s^{-1}$) (9), high conductivity (up to 400000 S $cm^{-1}$), and, for semiconducting nanotubes, tube diameter-dependent band gap ($E_{gap} \approx 1/R_{tube}$) (10).

Physical properties and device integration of individual nanoscale materials have been widely studied, while thin films of nanoscale materials is an emerging research area, with the advantage of statistical averaging for better reproducibility (11). Collective behavior of nanostructures can provide unique physical properties and enhanced device performance. A 2D network, often referred to as a thin film, made of randomly distributed CNTs can be regarded as a novel material. Because of the mixture of metallic and semiconducting nanotubes, CNT thin films show a semiconductor-metal transition as the film thickness increases (12). However, several techniques have been developed to isolate the semiconducting nanotubes, making CNTs a viable material for transistor applications. Thus, there are now numerous studies on nanotube thin films. For example, CNT thin films with density close to the percolation threshold show semiconductor behavior and can be used as the active layer in thin film transistors (3, 4, 13-18). However, most of these devices operate at very large voltages because the gate dielectric does not have a large capacitance (18).

Accordingly, there is a need in the art for thin film transistor devices where the thin film semiconductor is prepared from carbonaceous nanomaterials and where the gate dielectric material can enable device operation at low operating voltages.

SUMMARY

In light of the foregoing, the present teachings relate to thin film transistor (TFT) devices and methods of their fabrication, where the semiconductor is a thin film semiconductor derived from carbonaceous nanomaterials and where the gate dielectric is a hybrid self-assembled multilayer, and where the TFT can operate with good mobilities and current on/off ratios at low operating voltages.

The gate dielectric of the present TFT devices comprises an organic-inorganic hybrid multilayer. This hybrid multilayer generally includes an inorganic primer layer and one or more bilayers deposited thereon. Each bilayer includes a chromophore or "π-polarizable" layer and an inorganic capping layer composed of zirconia. The π-polarizable layer contains highly polarizable, "push-pull" π-electron compounds ("π-polarizable" compounds) that include a non-linear optical chromophore. The chromophore can include an azinylium ion. In various embodiments, the π-polarizable compound is heterobifunctionalized; at one end, a phosphonic acid terminal group allows formation of phosphonate bonds with the underlying zirconia layer, while functionalization of the other end with another hydrolyzable group allows coupling to the zirconia capping layer via non-phosphonate bonds. For example, the π-polarizable layer can include one or more π-polarizable moieties selected from:

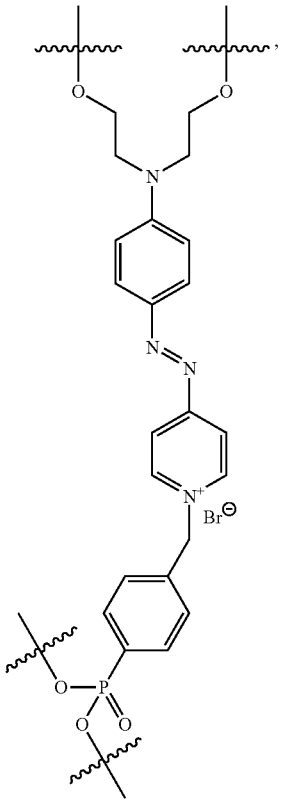

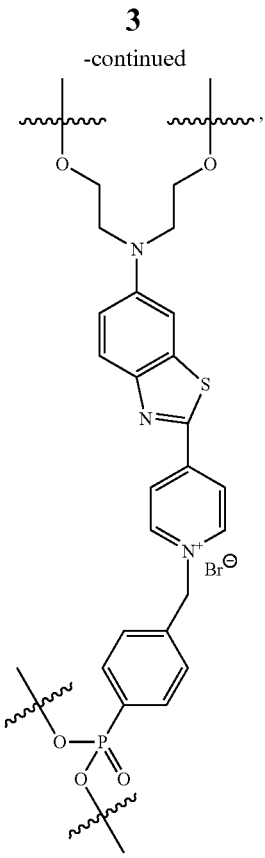

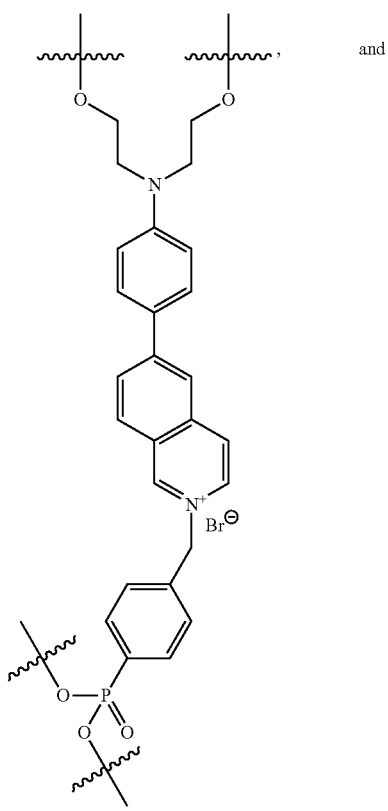 and

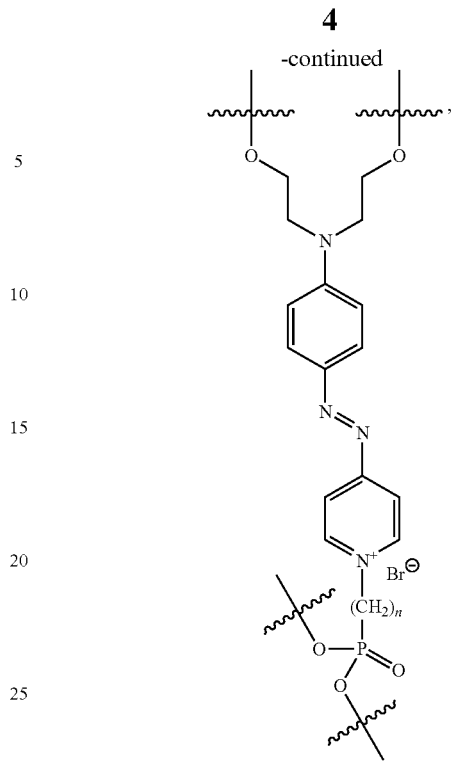

wherein n is an integer between 1 and 20.

Assembly of the organic-inorganic hybrid multilayer dielectric material generally involves coupling the π-polarizable layer described herein to a first zirconia (underlying) layer, and coupling a second zirconia (capping) layer to the π-polarizable layer, thereby providing a bilayer. In some embodiments, two or more bilayers can be formed by repeating the two coupling steps in sequence. In certain embodiments, the hybrid multilayer dielectric material is formed on a substrate, and the method can include forming an inorganic primer layer on the substrate. The substrate can be treated to provide hydroxyl groups on its surface. The primer layer can be composed of an inorganic oxide, which can be prepared by depositing (e.g., by spin-coating) a precursor sol on the substrate, followed by annealing at a temperature between about 100° C. and about 400° C. The precursor sol generally includes an inorganic oxide precursor such as metal alkoxides and metal chlorides, which undergo various forms of hydrolysis and polycondensation reactions. The precursor sol can include an organic solvent such as an alcohol. For example, the primer layer can be composed of zirconia ($ZrO_x$), which can be prepared by contacting the substrate with a zirconia sol that includes zirconium compounds such as $ZrCl_4$, $ZrOCl_2$, and $Zr(OR)_4$ (where each R independently can be a $C_{1-6}$ alkyl group) in an alcohol solvent. The precursor also can include a hydrolyzing catalyst.

To couple the π-polarizable layer to the primer layer, the primer layer-coated substrate can be contacted with a solution that includes one or more π-polarizable compounds. Such π-polarizable compounds typically are heterobifunctionalized and can include a phosphonic acid group as one of the two terminal functional groups prior to coupling to the primer layer. The other terminal functional group typically is a hydrolysable group that is not a phosphonic acid group. For example, the π-polarizable compounds can include as the other terminal functional group a dialkoxy amino group —$N(ROH)_2$, where each R independently can be a $C_{1-6}$ alkyl group. To illustrate, the one or more π-polarizable compounds can be selected from:

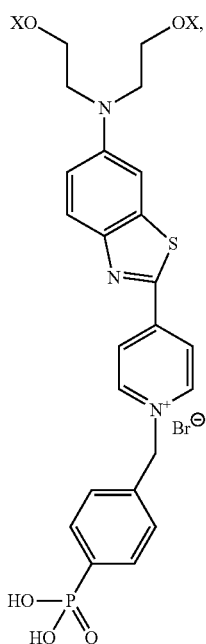
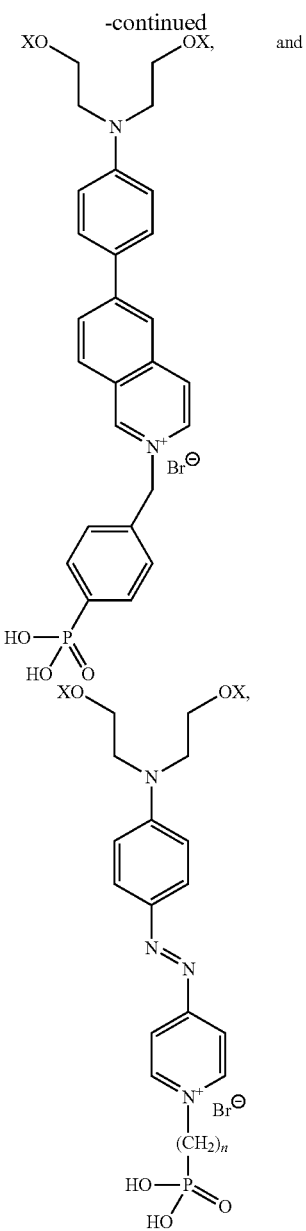

where X is H or a protecting group, and n is an integer between 1 and 20. The capping layer can be coupled to the π-polarizable layer using the same method for preparing a zirconia primer layer, i.e., depositing (e.g., by spin-coating) a zirconia sol on the π-polarizable layer, followed by annealing at a temperature between about 100° C. and about 400° C. If X is a protecting group, then the method can include a deprotecting step to convert the protecting group into H before the capping layer is coupled to the π-polarizable layer.

More generally, the inorganic oxide precursor sol and the organic precursor solution independently can include a solvent or solvent mixture comprising water and/or one or more organic solvents. For example, the solvent can be selected from water, an alcohol, an aminoalcohol, a carboxylic acid, a glycol, a hydroxyester, an aminoester, and a mixture thereof. In some embodiments, the solvent can be selected from water, methanol, ethanol, propanol, butanol, pentanol, hexyl alcohol, heptyl alcohol, ethyleneglycol, methoxyethanol, ethoxyethanol, methoxypropanol, ethoxypropanol, methoxybutanol, dimethoxyglycol, N,N-dimethylformamide, and mixtures thereof.

Each of the coupling steps for forming one or more bilayers in the hybrid multilayer can be performed by solution-phase deposition including printing (e.g., inkjet printing and various contact printing techniques such as screen-printing, gravure printing, offset printing, pad printing, lithographic printing, flexographic printing, and microcontact printing), spin-coating, drop-casting, zone casting, dip coating, blade coating, spraying, rod coating, or stamping. The annealing step for the inorganic layers can be carried out by various methods known in the art, for example, by using resistive elements (e.g., ovens), IR radiation (e.g., IR lamps), microwave radiation (e.g., microwave ovens), and/or magnetic heating.

The multilayer assembly method described herein can be performed under ambient atmosphere and can lead to highly ordered multilayer materials which show consistent electron density, surface roughness, and/or thickness. The resulting multilayer films were found to have large electrical capacitance (>400 nF/cm$^2$), low leakage current densities (in the order of $10^{-6}$-$10^{-7}$ A/cm$^2$), and good thermal stability.

The carbonaceous nanomaterial-derived thin film semiconductor can be deposited by any of the solution-phase methods described herein, for example, printing (e.g., inkjet printing and various contact printing techniques such as screen-printing, gravure printing, offset printing, pad printing, lithographic printing, flexographic printing, and microcontact printing), spin-coating, drop-casting, zone casting, dip coating, blade coating, spraying, rod coating, or stamping. The carbonaceous nanomaterials can be dispersed in a liquid medium with or without dispersants at a suitable concentration so that the resulting dispersion or ink can have the optimal viscosity for a respective solution-phase deposition method. For example, the carbonaceous nanomaterial-derived thin film semiconductor can be formed by printing a liquid medium containing substantially semiconducting single-walled carbon nanotubes dispersed therein, where the concentration of SWCNTs is between about 0.02 mg/ml and about 0.20 mg/ml. Substantially (e.g., about 90% or higher purity) semiconducting single-walled carbon nanotubes can be obtained by various methods known in the art used to separate semiconducting SWCNTs from metallic SWCNTs.

In certain embodiments, an interlayer can be provided between the hybrid multilayer and the carbonaceous nanomaterial-derived thin film semiconductor. For example, the interlayer can be a self-assembled monolayer, for example, a self-assembled monolayer derived from n-alkylphosphonic acid precursors, which also can be deposited in solution-phase. Electrical contacts including source and drain electrodes and the gate electrode can be formed in contact with the thin film semiconductor and with the gate dielectric, respectively, using methods known in the art.

The present carbonaceous nanomaterial-derived thin-film transistors can operate at low voltages (e.g., about −0.5V or less) and yet achieve high mobilities (e.g., at least about 1 cm$^2$/Vs) and high current on/off ratios (e.g., in the order of $10^3$), at least in part due to the unexpected compatibility with the organic-inorganic hybrid multilayer dielectric material described herein.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Figure 1:
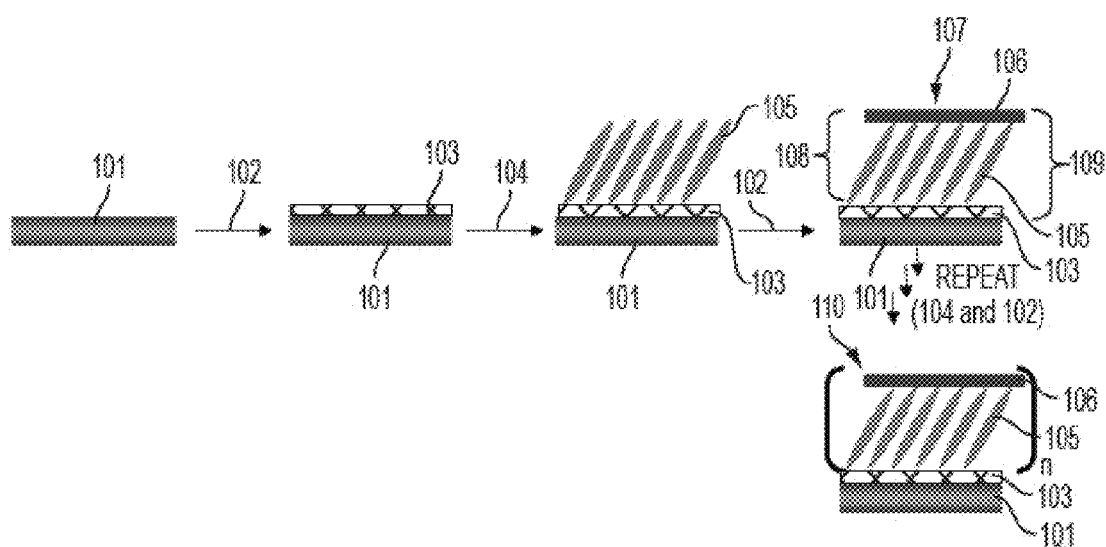
FIG. 1 is a schematic diagram that illustrates the fabrication of the present organic-inorganic hybrid multilayer dielectric material (Z-SAND multilayer).

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

The present teachings relate to transistor devices incorporating a thin film semiconductor derived from carbonaceous nanomaterials and a dielectric layer composed of an organic-inorganic hybrid self-assembled multilayer.

In various embodiments, the thin film semiconductor can be solution-phase deposited from a solution, dispersion, or suspension of a carbonaceous nanomaterial. As used herein, a "nanomaterial" generally has at least one dimension of about 100 nm or smaller. Examples of nanomaterials include nanoparticles (which can have irregular or regular geometries), nanospheres, nanowires (which are characterized by a large aspect ratio), nanoribbons (which has a flat ribbon-like geometry and a large aspect ratio), nanorods (which typically have smaller aspect ratios than nanowires), nanotubes, and nanosheets (which has a flat ribbon-like geometry and a small aspect ratio). Examples of carbonaceous nanomaterials include carbon nanotubes (CNTs, including both single-walled nanotubes (SWCNTs) and multiwalled nanotubes (MWCNTs)), graphene, graphene oxides, graphite sheets, and carbon nanodots.

The hybrid multilayer dielectric can be prepared reproducibly using reagents well-suited for ambient atmosphere fabrication. Specifically, the multilayer dielectrics can be prepared using an inorganic oxide precursor and a phosphonic acid-based organic precursor.

FIG. 1 is a schematic diagram illustrating the fabrication procedure of the present organic-inorganic hybrid multilayer dielectric material (Z-SAND). As illustrated, the fabrication of a Z-SAND multilayer 110 involves forming an inorganic (e.g., $ZrO_2$) primer layer 103 on a substrate 101 (e.g., silicon wafer), followed by iterative deposition of an organic π-polarizable layer 105 and an inorganic oxide capping layer 106.

Referring to FIG. 1, a substrate 101 is contacted with an inorganic oxide precursor sol 102. After annealing, an inorganic oxide primer layer 103 is formed adjacent the substrate 101. The primer layer-substrate composite is then contacted with an organic precursor solution 104 that includes a π-polarizable compound to form a π-polarizable layer 105. Contacting the multilayer that includes the π-polarizable layer 105, the inorganic primer layer 103, and the substrate 101 with the precursor sol 102 again provides an inorganic oxide capping layer 106. Together, the above steps provide a multilayer 107 (Z-SAND-1) that includes one bilayer 108 consisting of one inorganic capping layer 106 coupled to one π-polarizable layer 105. Illustrating with an embodiment where the organic π-polarizable layer 105 comprises 4-[[4-[bis(2-hydroxyethyl)amino]phenyl]diazenyl]-1-[4-(diethoxyphosphoryl)benzyl]pyridinium bromide as the π-polarizable compound, and inorganic layers that comprise $ZrO_x$, the bonding of the inorganic layer/π-polarizable layer/inorganic layer (collectively, 109) can be represented by:

As shown, the inorganic oxide primer layer 103 is coupled to the π-polarizable layer 105 via phosphonate bonds, whereas the π-polarizable layer 105 is coupled to the inorganic oxide capping layer 106 via non-phosphonate bonds. Performing "n" cycles of first depositing the organic precursor solution 104 then depositing the inorganic oxide precursor sol 102 provides a multilayer 110 (Z-SAND-n) that includes n bilayers 108.

In some embodiments, the inorganic oxide precursor sol can be prepared by dissolving a metal oxide precursor such as a metal chloride or a metal alkoxide in an organic solvent such as an alcohol. In certain embodiments, the precursor sol can be a zirconia sol which includes a zirconium compound such as $ZrCl_4$, $ZrOCl_2$, and $Zr(OR)_4$, wherein each R independently is a $C_{1-6}$ alkyl group. To accelerate hydrolysis, the precursor sol can include a hydrolyzing catalyst such as an acid. The inorganic oxide primer layer and/or capping layers can be deposited by spin-coating the precursor sol at a sufficient speed and for a sufficient period of time to achieve the desired thickness, followed by thermal curing at relatively low temperatures. For example, the annealing temperature can be less than about 400° C., less than about 300° C., or less than about 200° C. (e.g., about 150° C.). Typically, the thickness of the inorganic oxide capping layers is very thin (for example, less than about 3 nm, typically about 1 nm thick), whereas the inorganic oxide primer layer can be slightly thicker (e.g., about 2-5 nm thick).

The organic π-polarizable layer can be coupled to an underlying inorganic oxide layer by immersing (e.g., dipping) a substrate that includes the inorganic oxide layer in a solution of a suitable π-polarizable compound. The π-polarizable compound generally includes a non-linear optical chromophore which makes it highly polarizable. In various embodiments, the π-polarizable compound is heterobifunctionalized and includes a phosphonic acid group at one end. Exemplary π-polarizable compounds include

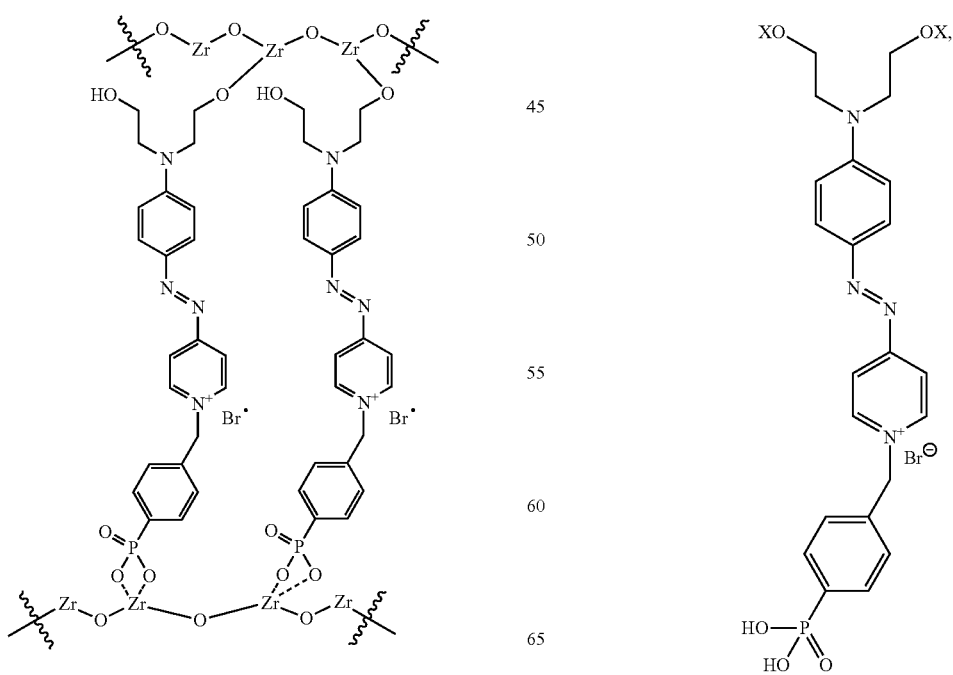

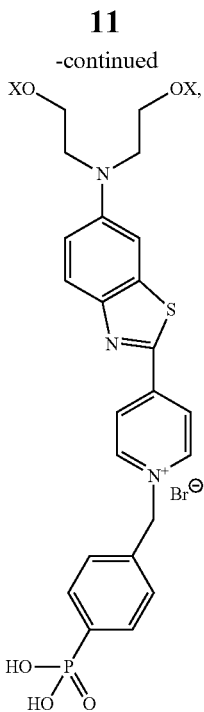

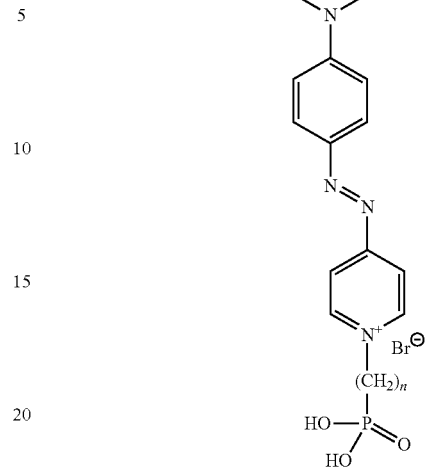

where X is H or a protecting group, and n is an integer between 1 and 20. In particular embodiments where the organic π-polarizable layer is prepared from the PAE precursor:

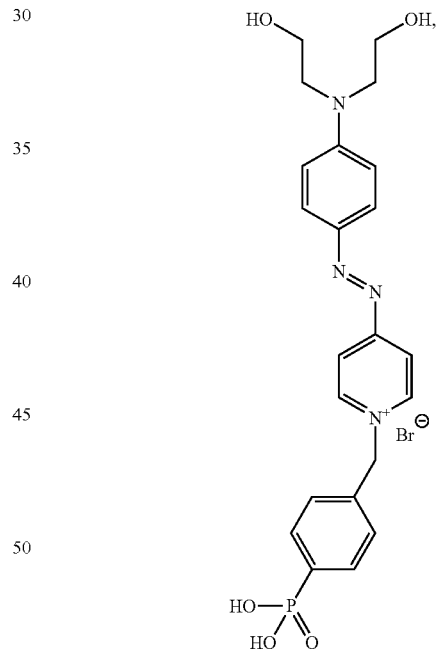

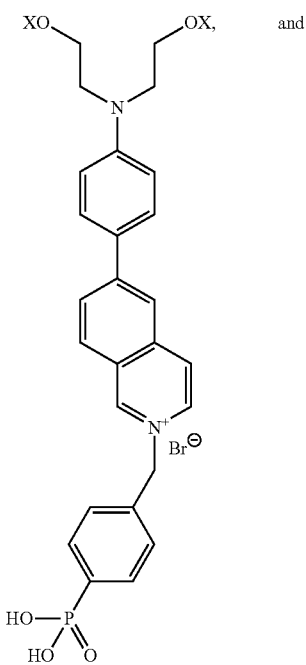 and the π-polarizable layer has a thickness of about 1.5 nm. To further illustrate, multilayer dielectric materials according to the present teachings that include one to four bilayers can have a total thickness ranging from about 5 nm to about 12 nm.

The hybrid multilayer dielectric materials described herein show well-defined growth characteristics including a high degree of order and structural control at the molecular level. The surface of the present multilayer film and the interfaces within the multilayer film can be very smooth, with typical surface roughnesses being less than 0.5 nm even for multilayer films that include as many as four bilayers. These organic-inorganic oxide hybrid multilayer dielectrics can exhibit superior dielectric properties (for example, when compared to bulk inorganic oxide films), having capacitance as high as about to 750 nF·cm$^{-2}$, and leakage current densities as low as about 10$^{-7}$ A·cm$^{-2}$. These multilayer dielectrics also can show good thermal stability, making them compatible with diverse semiconducting and electrically conductive materials that may require high temperature processing.

In some embodiments, the present hybrid multilayer films can be further functionalized with an organic self-assembled monolayer to reduce their surface hydrophilicity. For example, the self-assembled monolayer can be assembled from an n-alkylphosphonic acid, where the phosphonic acid groups react with the inorganic oxide capping layer and the n-alkyl chains can be used to interact with an overlying organic layer (e.g., an organic semiconductor). In certain embodiments, the n-alkylphosphonic acid can have at least six carbon atoms. In particular embodiments, the n-alkylphosphonic acid can have at least ten carbon atoms.

The desirable interfacial properties of the hybrid multilayers described herein render them compatible with diverse groups of semiconductor materials, including thin film semiconductors derived from various carbonaceous nanomaterials. Thin-film transistors fabricated with carbonaceous nanomaterial-based thin film semiconductors and the hybrid multilayer dielectrics described herein can exhibit high mobilities and current on/off ratios at low operating voltages.

Figure 2:
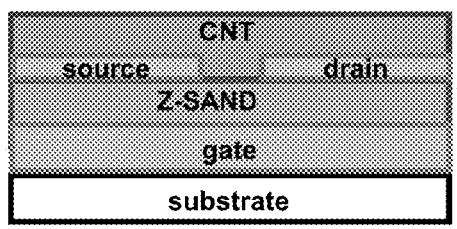
FIG. 2 illustrates the structure of a bottom-gate bottom-contact thin film transistor (TFT).

Accordingly, in one aspect, the present teachings can relate to a method of fabricating a thin film transistor. A thin film transistor can have different configurations, including bottom-gate bottom-contact structure (as shown in FIG. 2), bottom-gate top-contact structure, top-gate bottom-contact structure, and top-gate top-contact structure. A thin film transistor generally includes a substrate, electrical conductors (source/drain conductors and gate conductors), a dielectric component coupled to the gate conductor, and a semiconductor component coupled to the dielectric on one side and in contact with the source and drain conductors on the other side. As used herein, "coupled" can mean the simple physical adherence of two materials without forming any chemical bonds (e.g., by adsorption), as well as the formation of chemical bonds (e.g., ionic or covalent bonds) between two or more components and/or chemical moieties, atoms, or molecules thereof.

The present methods of fabricating a thin film transistor can include assembling an organic-inorganic hybrid multilayer dielectric material as described herein, for example, on the gate electrode, and depositing a thin film semiconductor either directly adjacent to the organic-inorganic hybrid multilayer dielectric material or indirectly adjacent to the organic-inorganic hybrid multilayer dielectric material via an interlayer. The thin film semiconductor can be deposited by various methods known in the art, including both vapor-phase methodologies (e.g., atomic layer or chemical/physical vapor deposition) and solution-phase methodologies (e.g., inkjet printing, screen-printing, gravure printing, offset printing, pad printing, lithographic printing, flexographic printing, and microcontact printing, spin-coating, drop-casting, zone casting, dip coating, blade coating, spraying, rod coating, or stamping). For example, to deposit a thin film semiconductor comprising carbonaceous nanomaterials via solution-phase, the carbonaceous nanomaterials can be dispersed in a solvent with or without dispersants at a suitable concentration so that the resulting dispersion or ink can have the optimal viscosity for a respective solution-phase deposition method. The interlayer can be a self-assembled monolayer, for example, a self-assembled monolayer derived from n-alkylphosphonic acid precursors as described herein, which also can be deposited in solution-phase.

In certain embodiments, the carbonaceous nanomaterials can be carbon nanotubes (single-walled carbon nanotubes or multi-walled carbon nanotubes). The carbon nanotubes can be mostly semiconducting CNTs (e.g., less than about 10%, less than about 5%, less than about 3%, less than about 2%, or about 1% or less of the carbon nanotubes are metallic CNTs). In particular embodiments, the carbon nanotubes can be pre-sorted according to electronic type using density gradient centrifugation as described in U.S. Patent Publication No. 20080217588 and U.S. Patent Publication No. 20100072458. The carbon nanotubes can be dispersed in a liquid medium, e.g., a solvent or a solvent mixture. For example, the carbon nanotubes can be dispersed in an organic solvent such as pyrrolidinone with or without dispersants. Other exemplary suitable organic solvents for dispersing carbon nanotubes with or without dispersants include N-methylpyrrolidinone (NMP), propylene glycol monomethyl ether acetate (PGMEA), cyclohexanone, methyl ethyl ketone (MEK), and methyl isopropyl ketone. Suitable dispersants include polymers such as polyvinyl alcohol, polyacrylamide, polystyrene, polystyrene sulfonate, polyphenylene vinylene; nucleic acids such as single-strand DNA components; as well as low-molecule compounds such as various amine compounds, porphyrin compounds, and pyrene compounds. In other embodiments, the carbon nanotubes can be dispersed in water with one or more surfactants. The surfactant(s) can be ionic (anionic/cationic/zwitterionic) or nonionic. Examples of anionic surfactants include fatty acid salts and cholates as carboxylate and sodium linear alkylbenzenesulfonate and sodium lauryl sulfate as sulfonate. Examples of cationic surfactants include alkyl trimethyl ammonium salts, dialkyldimethyl ammonium salts, and alkylbenzyldimethyl ammonium salts. Examples of zwitterionic (amphoteric) surfactants include alkyldimethylamine oxide and alkylcarboxy betaine. Examples of nonionic surfactants include polyoxyethylene alkyl ether, fatty acid sorbitan ester, alkyl polyglucoside, fatty acid diethanolamide, and alkylmonoglyceryl ether. In particular embodiments, the carbon nanotubes can be dispersed in water with one or more anionic surfactants selected from alkyl sulfate salts having from 10 to 14 carbon atoms (e.g., sodium dodecyl sulfate (SDS) having 12 carbon atoms, sodium tetradecyl sulfate (STS) having 14 carbon atoms) and sodium cholate (SC).

In certain embodiments, the carbonaceous nanomaterials can be graphene nanomaterials. The graphene nanomaterials can be pre-sorted according to thickness using density gradient centrifugation as described in U.S. Patent Publication No. 20110037033. The graphene nanomaterials can be dispersed in a solvent or solvent mixture. For example, the carbon nanotubes can be dispersed in water with one or more planar surfactants such as sodium cholate, sodium carboxymethylcellulose, or other surface active components including one or more planar organic groups. In certain embodiments, the carbonaceous nanomaterials can be graphene oxides, graphite sheets, or carbon nanodots.

The present methods of fabricating a carbonaceous nanomaterial-based TFT also can include forming source and drain electrodes in contact with the thin film semiconductor (for example, deposited on top of the thin film semiconductor for top-contact structures, or deposited on top of the hybrid multilayer dielectric layer for bottom-contact structures). The gate electrode and the other electrical contacts (source and drain electrodes) independently can be composed of metals (e.g., Au, Ag, Al, Ni, Cu), transparent conducting oxides (e.g., ITO, IZO, ZITO, GZO, GIO, GITO), or conducting polymers (e.g., poly(3,4-ethylenedioxythiophene)poly(styrenesulfonate) (PEDOT:PSS), polyaniline (PANI), or polypyrrole (PPy)). For embodiments where the electrical contacts are composed of a metal, vacuum deposition can be used, typically through a shadow mask.

The substrate component for a thin film transistor can be selected from doped silicon, glass, aluminum or other metals alone or coated on a polymer or other substrate, a doped polythiophene, as well as polyimide or other plastics.

The following examples are provided to illustrate further and to facilitate the understanding of the present teachings and are not in any way intended to limit the invention.

EXAMPLE 1

Synthesis of Phosphonic Acid-Based π-Electron Reagent

Various π-polarizable compounds that are suitable for use in the present π-polarizable layer can be synthesized according to those skilled in the art from commercially available reagents.

Scheme 1 below illustrates a possible synthetic scheme of a representative phosphonic acid-based π-polarizable compound (4) or (PAE).

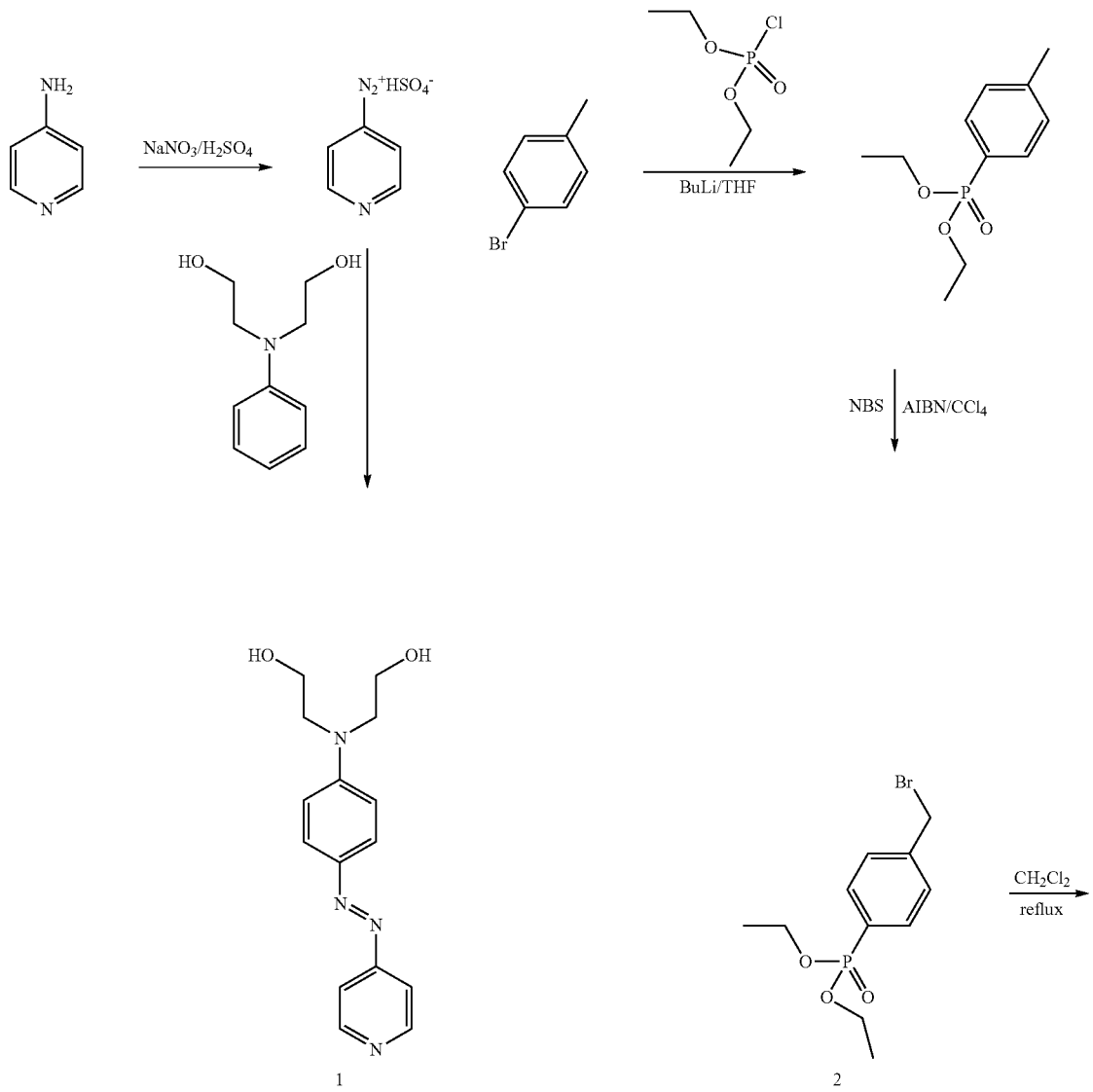

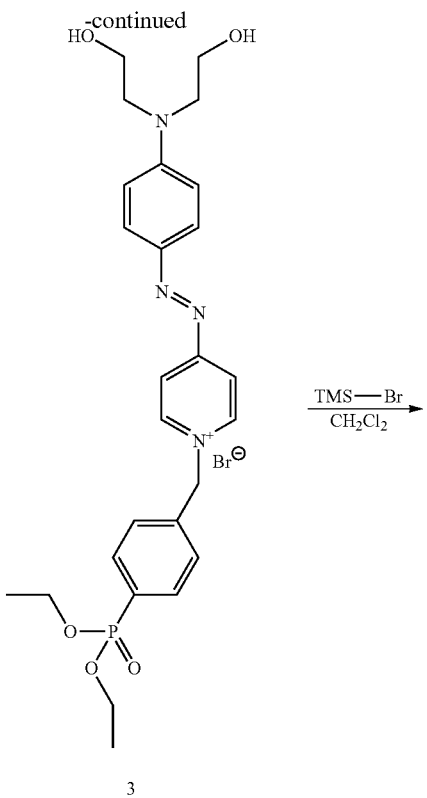

3

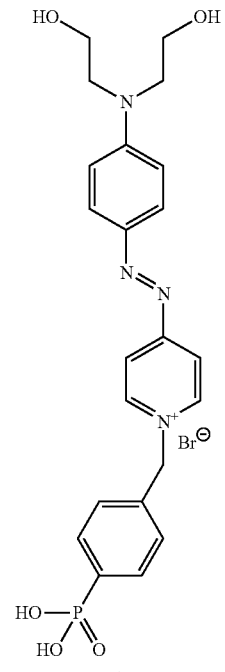

4

Synthesis of 4-[[4-[N,N-bis(hydroxylethyl)amino]phenyl]azo]pyridine (1)

4-[[4-[N,N-Bis(hydroxylethyl)amino]phenyl]azo]pyridine (1) was prepared according to procedures described in Lin et al., *J. Am. Chem. Soc.*, 118: 8034 (1996). Specifically, pyridin-4-amine was reacted with a mixture of sodium nitrate and sulfuric acid, followed by reaction with 2,2'-(phenylazanediyl)diethanol.

Synthesis of diethyl 4-(bromomethyl)phenylphosphonate (2)

A solution of 1-bromo-4-methylbenzene (3.42 g, 20 mmol) in 140 mL of anhydrous THF was stirred at −78° C. under nitrogen and one equivalent of n-BuLi in hexane (1.6 M) was added. After 10 min, diethylchlorophosphate (3.45 g, 20 mmol) was added to the reaction mixture, and then stirring was continued for 1 hr. After reaching room temperature, the reaction mixture was extracted with ethyl ether (100 mL), then washed with aqueous NaHCO$_3$ (~1 g in 100 mL of H$_2$O). The organic layer was separated and concentrated to give a suspension of diethyl p-tolylphosphonate. $^1$H NMR (500 MHz, CD$_3$Cl): δ 7.70-7.74 (m, 2H), 7.28-7.30 (m, 2H), 4.06-4.15 (m, 4H), 2.42 (s, 3H), 1.31-1.34 (t, 6H).

To the suspension of diethyl p-tolylphosphonate (0.73 g, 3.2 mmol) was added a small amount of azobisisobutyronitrile (0.016 g, 0.1 mmol, in portions) and N-bromosuccinimide (0.57 g, 3.2 mmol) in anhydrous CCl$_4$ (30 mL). The mixture was refluxed for 4 h, then cooled to 10° C. and filtered to remove succinimide. The filtrate was washed with water (30 mL) and brine (30 mL) and then dried over anhydrous Na$_2$SO$_4$. After filtration, the crude product was obtained via evaporation of solvent and purified by chromatography on silica gel (hexene/ethyl acetate: 2/1 as eluent) to provide diethyl 4-(bromomethyl)phenylphosphonate as a colorless oil. $^1$H NMR (500 MHz, CD$_3$Cl): δ 7.79-7.83 (m, 2H), 7.50-7.52 (m, 2H), 4.51 (s, 2H), 4.09-4.18 (m, 4H), 1.33-1.36 (t, 6H).

Synthesis of 4-[[4-[bis(2-hydroxyethyl)amino]phenyl]diazenyl]-1-[4-(diethoxyphosphoryl)benzyl]pyridinium bromide (3)

A mixture of 4-[[4-[N,N-bis(hydroxylethyl)amino]phenyl]azo]pyridine (1) (0.286 g, 1.00 mmol, and 4-(bromomethyl)phenylphosphonate (2) (0.317 g, 1.00 mmol) was dissolved in CH$_2$Cl$_2$ (10 mL). The red mixture was heated under a nitrogen atmosphere at 60° C. for 4 h. The solvent was then removed under high vacuum and the residue was dried under high vacuum overnight. $^1$H NMR (500 MHz, DMSO-d$_6$): δ 9.07 (d, 2H, J$_{H-H}$=6 Hz), 8.14 (d, 2H, J$_{H-H}$=7 Hz), 7.90 (d, 2H, J$_{H-H}$=9.5 Hz), 7.76-7.80 (m, 2H), 7.62-7.64 (m, 2H), 7.07 (d, 2H, J$_{H-H}$=9.5 Hz), 5.88 (s, 2H), 4.95-4.97 (m, 2H), 3.99-4.03 (m, 4H), 3.99-4.03 (m, 4H), 3.66-3.72 (m, 8H), 1.22 (t, 3H). $^{31}$P NMR (400 MHz, DMSO-d$_6$): δ −18.07 (s, 1P). High resolution EI-MS: Calculated for C$_{26}$H$_{34}$N$_4$O$_5$P$^+$, 513.22744. Found, 513.22668.

Synthesis of 4-[[4-[bis(2-hydroxyethyl)amino]phenyl]diazenyl]-1-[4-(diethoxyphosphoryl)benzyl]pyridinium bromide (4)

To a solution of 4-[[4-[bis(2-hydroxyethyl)amino]phenyl]diazenyl]-1-(4-phosphonobenzyl)pyridinium bromide (3) (0.297 g, 0.5 mmol) in anhydrous CH$_2$Cl$_2$ (30 mL), trimethylbromosilane (10 eq., 0.66 mL) was added dropwise over 10 min. The mixture was then stirred overnight at room temperature under a nitrogen atmosphere. After completion of the reaction, the solvent was then evaporated and the residue was dissolved in methanol (5 mL). Filtration and evaporation of solvent afforded 0.29 g of the pure product (PAE) as a red powder. $^1$H NMR (500 MHz, DMSO-$d_6$): δ 9.05 (d, 2H, $J_{H-H}$=7 Hz), 8.12 (d, 2H, $J_{H-H}$=6.5 Hz), 7.90 (d, 2H, $J_{H-H}$=9.5 Hz), 7.70-7.74 (m, 2H), 7.55-7.57 (m, 2H), 7.10 (d, 2H, $J_{H-H}$=9.5 Hz), 5.04 (s, 2H), 3.65-3.74 (m, 8H). $^{31}$P NMR (400 MHz, DMSO-$d_6$): δ −12.83 (s, 1P). High resolution EI-MS: Calculated for $C_{22}H_{26}N_4O_5P^+$, 457.16408. Found, 457.16532.

EXAMPLE 2

Z-SAND Multilayer Film Fabrication

Hybrid multilayer films including only one bilayer (Z-SAND-1) were fabricated by immersing a $ZrO_2$ primer layer-coated substrate in a 3 mM methanol solution of the phosphonic acid-based π-electron (PAE) reagent (Example 1) at about 60° C. for about 30 minutes, followed by rinsing with methanol. Then, the $ZrO_2$ interlayer was deposited by the same method used for the primer layer. Z-SAND-2, 3, and 4 structures were formed by alternating repetition of the PAE and ultra-thin $ZrO_2$ bilayer depositions. PAE solutions can be reused multiple times without any noticeable detrimental effects on film quality.

Specifically, heavily doped n$^+$-silicon (Montco Silicon Technologies, Inc.) substrates were cleaned in EtOH (Aldrich, absolute, 200 proof) with sonication for 2 min and then dried with flowing nitrogen, followed by oxygen plasma treatment for 5 min to remove organic contamination and to improve wettability. A 0.01 M solution of zirconium (IV) chloride was prepared by dissolving the salt in ethanol (absolute >99.5%, Aldrich), followed by the addition of a mixture of nitric acid and DI water (molar ratio; $ZrCl_4$:$HNO_3$:$H_2O$=1: 10:10). The resulting zirconium precursor solution was heated to 50° C. for 3 h to accelerate hydrolysis which leads to zirconium sol (Zr sol) formation. The dielectric organic-inorganic multilayer consists of a gate/substrate coated first of a primer inorganic layer (composed of, for example, zirconia or $ZrO_x$) and then of one or more periodic bilayers, where each bilayer consists of an organic layer (also referred herein as either a π-polarizable layer or a chromophore layer) and a capping layer (composed of zirconia or $ZrO_x$). The deposition of the primer layer was achieved by spin-coating the Zr sol at 5000 rpm for about 30 s on the gate/substrate, followed by curing at about 150° C. for about 20 min. This procedure was performed twice to complete the $ZrO_2$ primer layer. Next, for the deposition of the chromophore layer, the substrate with the primer layer was immersed in a solution of the phosphonic-acid based π-electron precursor (PAE; 3.0 mM in methanol) at about 60° C. for about 30 min. After rinsing with MeOH, the samples were dried under a nitrogen stream. Finally, the $ZrO_x$ capping layer was coupled to the chromophore layer by spin coating the same Zr sol at 5000 rpm for about 30 s on top of the chromophore layer, followed by thermal curing at about 150° C. for about 20 min. Fabrication of n-organic-$ZrO_x$ multilayers (Z-SAND-n) was achieved by n repetition of the last two steps. All Zr sol precursors were filtered through a 0.2 μm pore size PTFE membrane syringe filter prior to spin-coating, and were spin-coated under a controlled atmosphere of less than 10% relative humidity (measured with a Fisher Scientific Traceable Hydrometer-Thermometer-Dew Point probe).

EXAMPLE 3

Z-SAND Multilayer Film Characterization

The structural regularity of the Z-SAND multilayers fabricated by the present iterative two-step process (PAE+$ZrO_2$ layer) (FIG. 1) was characterized by a full complement of physicochemical techniques: 1) transmission optical spectroscopy (UV-Vis) to characterize assembly chemistry and microstructural regularity, 2) X-ray reflectivity (XRR) to characterize film thickness, density, and interfacial roughness, 3) transmission electron microscopy (TEM) to characterize film thickness and microstructural regularity, and 4) atomic force microscopy (AFM) to characterize surface morphology and roughness.

Optical absorption spectra were acquired with a Varian Cary 5E spectrophotometer. Film thicknesses of the multilayer films were analyzed by X-ray reflectivity (XRR) using wavelength λ=0.1541 nm CuKα radiation at an 18 kW Rigaku ATX-G Thin-film Diffraction Workstation. The structural details of the electron density profile were obtained by fitting the XRR data to a multilayer model calculated by the Abeles Matrix method (see e.g., Parratt, *Phys. Rev.*, 95: 939 (1954); and Nelson, *J. Appl. Crystallogr.*, 39: 273 (2006)). Each bilayer, n, is defined by its thickness, $d_n$, electron density, $ρ_n$, interface roughness, $σ_n$, to generate a complete electron density profile (ρ(z)). Four kinds of multilayer systems were analyzed: Z-SAND-n, where n is the number of bilayers and n=1, 2, 3, and 4. Z-SAND-1 was modeled as 3 slabs (primer $ZrO_2$ layer, PAE layer, and $ZrO_2$ interlayer) with a Si substrate and an air superstrate. For thicker multilayers, two slabs were added to model each additional layer, corresponding to the organic and inorganic components. Interparameter constraints and batch-fitting procedures were employed in order to reduce the number of free parameters, limit solutions to a physically reasonable range, and enforce structural consistency between multilayer models. Cross-sectional TEM samples were prepared and imaged using a JEOL-2100F scanning/transmission electron microscope (S/TEM) and a Hitachi HD-2300A scanning electron microscope (STEM), with both bright-field (BF) and high-angle annular dark-field (HAADF) detectors. The morphologies of all thin films were evaluated by atomic force microscopy (AFM) using a JEOL-5200 scanning probe microscope with silicon cantilevers in the tapping mode.

The UV-Vis data demonstrate the uniformity of the self-assembly process. Specifically, the optical absorbance of the chromophore at λ=575 nm shows a linear increase with the number of bilayers from n=1 to n=4. These data demonstrate that each PAE layer contains the same density of chromophores and that the surface chemistry and quality of the n-$ZrO_2$ layers is identical. The XRR-derived thicknesses of the multilayers also are found to increase linearly with n, in both cases where the multilayer samples were annealed at 150° C. and 400° C., respectively. These data demonstrate the regularity and uniformity of the periodic structure of the multilayer as well as their excellent thermal stability. Atomic force microscope (AFM) images of the multilayers is consistent with a crack/pinhole-free surface morphologies. The images show the surface of the hybrid multilayer dielectrics as very smooth, exhibiting a maximum root mean square (RMS) roughness of about 0.25 nm for n=2 and about 0.40 nm for n=4.

To assess the dielectric properties of the Z-SAND multilayer films, Metal-Insulator-Semiconductor (MIS) sandwich structure devices were fabricated by thermal Au electrode deposition (dimension: 200 μm×200 μm) on Z-SAND-coated $n^{++}$-Si substrates. MIS direct current measurements were carried out under ambient conditions using a Signatone probestation interfaced to a Keithley 6430 Sub-Femtoamp Remote Source Meter and a Keithley 2400 source meter with a locally written LabVIEW program. An impedence analyzer (HP 4192A) was used for capacitance measurements.

Table 1 below summarizes various properties of the hybrid multilayer dielectric materials described herein.

TABLE 1

Summary of Film and Dielectric Properties for Z-SAND- 1 to 4 Films

| | Thickness (nm) | Roughness (nm) | J (A/cm$^2$) at 2 MV/cm | $C_i$ (nF/cm$^2$) |
|---|---|---|---|---|
| Z-SAND- 1 | 4.7 ± 0.1 | 0.15 | 7 × 10$^{-8}$ | 750 |
| Z-SAND- 2 | 6.7 ± 0.1 | 0.25 | 2 × 10$^{-7}$ | 633 |
| Z-SAND- 3 | 9.5 ± 0.2 | 0.36 | 3 × 10$^{-7}$ | 535 |
| Z-SAND- 4 | 11.3 ± 0.8 | 0.40 | 3 × 10$^{-7}$ | 465 |

EXAMPLE 4

Fabrication and Characterization of Thin-Film Transistors Using Carbonaceous Nanomaterial Semiconductors on Z-SAND Mutilayer Films Procedure:

Bottom-gate bottom-contact TFTs (FIG. 2) were fabricated using carbon nanotubes (CNTs) as the semiconducting material. High capacitance Z-SAND was applied on N-doped silicon wafers (100) and served as gate dielectrics. Prior to the semiconductor deposition, 300 Å gold source/drain electrodes were vapor deposited through a stencil mask to define the transistor channel. 99%-pure semiconducting SWCNTs produced by density gradient ultracentrifugation was dispersed in 1-cyclohexyl-2-pyrrolidinone and inkjet-printed onto the channel under the substrate temperature of about 60-120° C. The completed transistors was then rinsed with 1-cyclohexyl-2-pyrrolidinone, spin-dried and baked in vacuum oven at about 60-120° C. for about 0.5-15 hours. The channel lengths and widths are 50-200 μm and 500-2000 μm, respectively.

Measurements:

Atomic force microscopy (AFM) was used to characterize surface morphology and roughness of the inkjet-printed CNT films. TFT measurements were carried out under ambient conditions using a Signatone probestation interfaced to a Keithley 6430 Sub-Femtoamp Remote Source Meter and a Keithley 2400 source meter with a locally written LabVIEW program. The gate electrode was accessed through an ohmic contact to the doped silicon.

Figure 3:
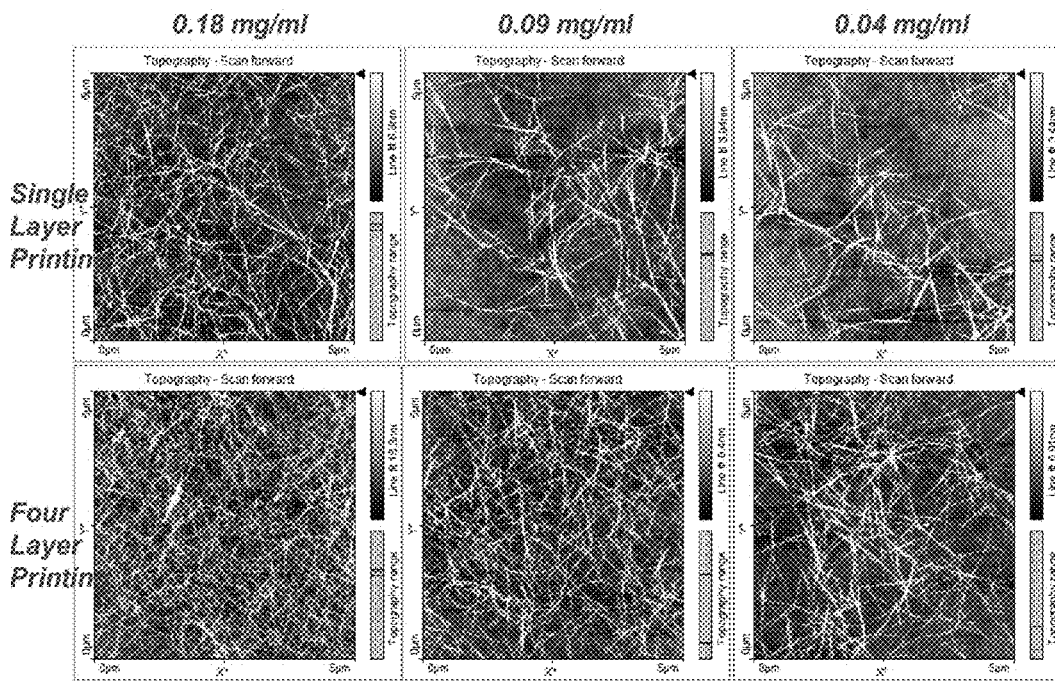
FIG. 3 shows AFM images of inkjet-printed carbon nanotube (CNT) films deposited from different concentrations and for multiple print passes.

FIG. 3 shows AFM images of inkjet-printed CNT films deposited from different concentrations and for multiple print passes.

Figure 4:
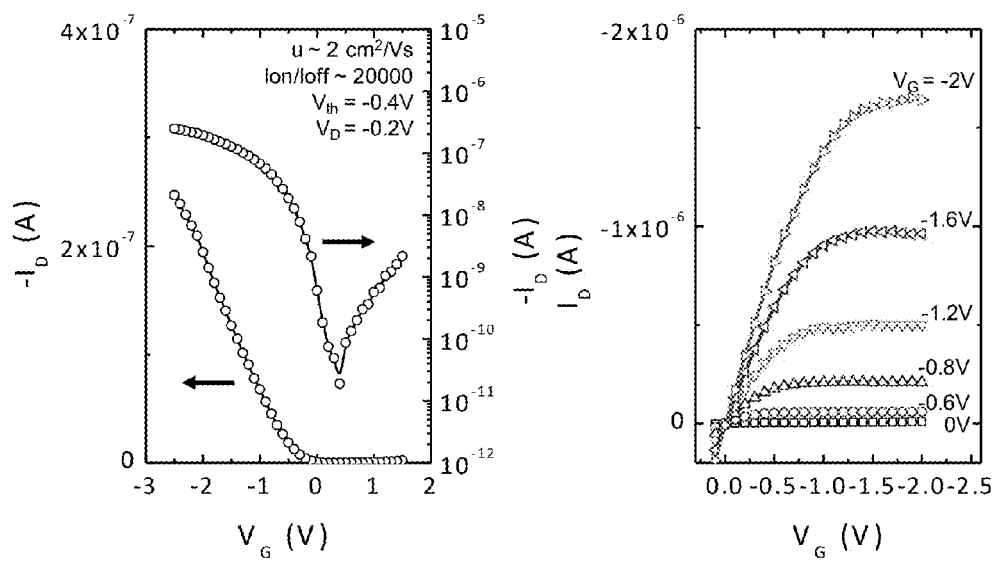
FIG. 4 shows the transfer (left) and output (right) plots for a representative CNT TFT incorporating Z-SAND as the dielectric component.

FIG. 4 shows the transfer (left) and output (right) plots for a representative CNT TFT. A mobility of about 1-5 cm$^2$/Vs was obtained, with threshold voltage ranging between about 0~−0.5 V, and on-off current ratio of >10$^3$.

REFERENCES

1. Shipway, A. K. et al., *Chem Phys Chem*, 1: 18-52 (2000).
2. Cui, Y. et al., *Nano Lett.*, 3: 149-152 (2003).
3. Chen, B. H. et al., *Appl. Phys. Lett.*, 88: 093502-093504 (2006).
4. Kaempgen, M. et al., *Nano Lett.*, 9: 1872-1876 (2009).
5. Stankovich, S. et al., *Nature*, 442: 282-286 (2006).
6. Geim, A. K. et al., *Nat. Mater.*, 6: 183-191 (2007).
7. Berger, C. et al., *J. Phys. Chem. B*, 108: 19912-19916 (2004).
8. Saito, R. et al., *Phys. Rev. B*, 46: 1804-1811 (1992).
9. Durkop, T. G. et al., *Nano Lett.*, 4: 35-39 (2004).
10. Kane, C. M. et al., *Phys. Rev. Lett.*, 78: 1932-1935 (1997).
11. Snow, E. S. et al., *Appl. Phys. Lett.*, 82: 2145-2147 (2003).
12. Bekyarova. E., *J. Am. Chem. Soc.*, 127: 5990 (2005).
13. Vaillancourt J. et al., *Appl. Phys. Lett.*, 93: 243301-243303 (2008).
14. Fukao, T. et al., *Jpn. J. Appl. Phys., Part 1*, 45: 6524 (2006).
15. Gulyaev, Y. V. et al., *J. Vac. Sci. Technol.*, B, 15: 422 (1997).
16. Cheah, J. W. et al., *Appl. Phys. Lett.*, 93: 082103 (2008).
17. Artukovic, E. et al., *Nano Lett.*, 5: 757 (2005).
18. DiBenedetto, S. A. et al., *J. Adv. Mater.*, 21: 1407-1433 (2009).

Each of the journal literature publications and patent publications referenced herein is incorporated by reference for all purposes.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

What is claimed is:

1. A thin film transistor comprising:
    a thin film semiconductor comprising carbonaceous nanomaterials;
    an organic-inorganic hybrid multilayer dielectric material comprising an inorganic oxide primer layer and one or more bilayers deposited thereon, wherein each bilayer comprises a π-polarizable layer and an inorganic oxide capping layer;
    a gate electrode in contact with the hybrid multilayer dielectric material; and
    source and drain electrodes in contact with the thin film semiconductor;
    wherein the inorganic oxide primer layer is coupled to the π-polarizable layer of one of the bilayers via phosphonate bonds, and the inorganic oxide capping layer in each bilayer is coupled to the π-polarizable layer via bonds other than phosphonate bonds.

2. The thin film transistor of claim 1, wherein the hybrid multilayer comprises two or more bilayers, and wherein the π-polarizable layer of a bilayer is coupled to the inorganic oxide capping layer of an underlying bilayer via phosphonate bonds.

3. The thin film transistor of claim 1, wherein the π-polarizable layer comprises one or more π-polarizable compounds, and each π-polarizable compound comprises a nonlinear optical chromophore.

4. The thin film transistor of claim 1, wherein the π-polarizable layer comprises one or more π-polarizable compounds selected from:

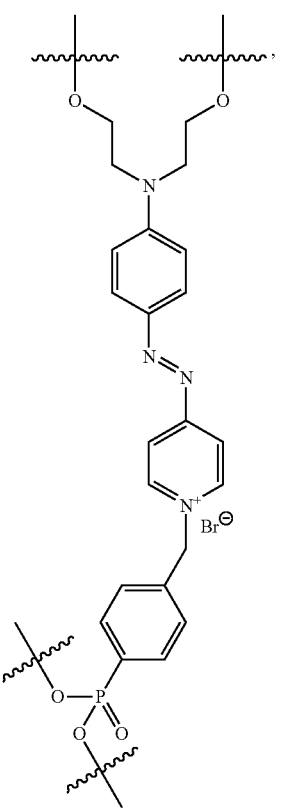
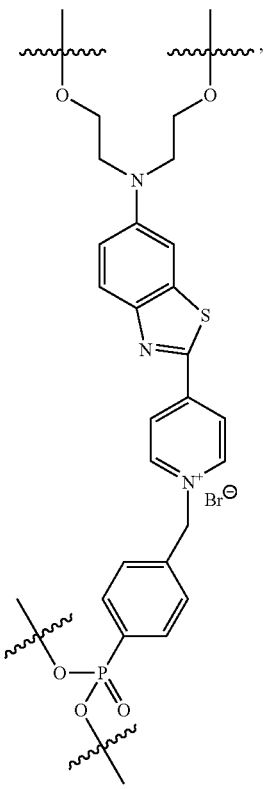
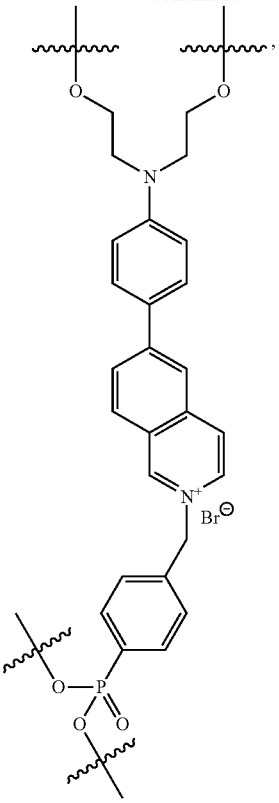
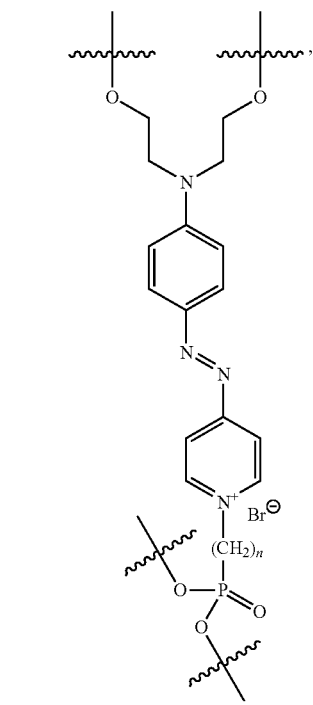
wherein n is an integer between 1 and 20.
5. The thin film transistor of claim 1, wherein the carbonaceous nanomaterials are selected from single-walled nanotubes (SWCNTs), multiwalled nanotubes (MWCNTs), graphene, graphene oxides, graphite sheets, and carbon nanodots.

6. A thin film transistor comprising:
a thin film semiconductor comprising carbonaceous nanomaterials;
an organic-inorganic hybrid multilayer dielectric material comprising an inorganic oxide primer layer and one or more bilayers deposited thereon, wherein each bilayer comprises a π-polarizable layer and an inorganic oxide capping layer;
a gate electrode in contact with the hybrid multilayer dielectric material;
source and drain electrodes in contact with the thin film semiconductor; and
an interlayer between the hybrid multilayer dielectric material and the thin film semiconductor, wherein the interlayer comprises a self-assembled monolayer comprising n-alkylphosphonic acid.

7. The thin film transistor of claim 6, wherein the carbonaceous nanomaterials are selected from single-walled nanotubes (SWCNTs), multiwalled nanotubes (MWCNTs), graphene, graphene oxides, graphite sheets, and carbon nanodots.

8. The thin film transistor of claim 6, wherein the n-alkylphosphonic acid comprises at least 6 carbon atoms.

9. A method of fabricating a thin film transistor, the method comprising:
assembling an organic-inorganic hybrid multilayer dielectric material by performing one or more times the steps of (a) coupling a π-polarizable layer to a first inorganic oxide layer, and (b) coupling a second inorganic oxide layer to the π-polarizable layer; and
depositing a thin film semiconductor either directly adjacent to the organic-inorganic hybrid multilayer dielectric material or indirectly adjacent to the organic-inorganic hybrid multilayer dielectric material via an interlayer, wherein the thin film semiconductor is deposited from a dispersion comprising carbonaceous nanomaterials, and wherein depositing the thin film semiconductor comprises using a solution-phase method.

10. The method of claim 9, wherein the carbonaceous nanomaterials are selected from single-walled nanotubes (SWCNTs), multiwalled nanotubes (MWCNTs), graphene, graphene oxides, graphite sheets, and carbon nanodots.

11. The method of claim 9, wherein assembling the organic-inorganic hybrid multilayer dielectric material comprises performing one or more times the steps of (a) coupling a π-polarizable layer to a first zirconia layer, and (b) coupling a second zirconia layer to the π-polarizable layer.

12. The method of claim 11, wherein coupling the second zirconia layer to the π-polarizable layer comprises contacting the π-polarizable layer with a zirconia sol.

13. The method of claim 12, wherein the zirconia sol comprises a zirconium compound in an alcohol solvent or a solvent mixture comprising an alcohol.

14. The method of claim 13, wherein the zirconium compound is selected from $ZrCl_4$, $ZrOCl_2$, and $Zr(OR)_4$, wherein each R independently is a $C_{1-6}$ alkyl group.

15. The method of claim 14, wherein the zirconia sol comprises a hydrolyzing catalyst.

16. The method of claim 11, wherein coupling the second zirconia layer to the π-polarizable layer comprises spin-coating a zirconia sol on the π-polarizable layer and annealing at a temperature between about 100° C. and about 400° C.

17. The method of claim 9, comprising assembling a monolayer between the organic-inorganic hybrid multilayer dielectric material and the thin film semiconductor.

18. The method of claim 17, wherein assembling the monolayer comprises contacting the organic-inorganic hybrid multilayer dielectric material with a solution comprising an n-alkylphosphonic acid.

* * * * *